United States Patent
Pao et al.

[11] Patent Number: 5,931,371
[45] Date of Patent: Aug. 3, 1999

[54] STANDOFF CONTROLLED INTERCONNECTION

[75] Inventors: Yi-Hsin Pao, Livonia; Chan-Jiun Jih, Troy; Jun Ming Hu, Canton; Vivek Amir Jairazbhoy, Farmington Hills; Richard Keith McMillan, II, Dearborn; Xu Song, Westland, all of Mich.

[73] Assignee: Ford Motor Company, Dearborn, Mich.

[21] Appl. No.: 08/784,333

[22] Filed: Jan. 16, 1997

[51] Int. Cl.$^6$ .......................... B23K 31/02; B23K 35/24; B23K 35/14
[52] U.S. Cl. .................. 228/180.22; 228/175; 228/246; 361/770; 361/771
[58] Field of Search .............................. 228/180.22, 175, 228/246; 361/770, 771; 174/138 D

[56] References Cited

U.S. PATENT DOCUMENTS

| | | | |
|---|---|---|---|
| 3,392,442 | 7/1968 | Napier et al. | 29/628 |
| 3,900,153 | 8/1975 | Beerwerth et al. | 228/246 |
| 4,402,450 | 9/1983 | Abraham et al. | 228/180 |
| 4,760,948 | 8/1988 | Spiecker | 228/180.2 |
| 4,878,611 | 11/1989 | LoVasco et al. | 228/180.2 |
| 5,056,215 | 10/1991 | Blanton | 29/840 |
| 5,093,986 | 3/1992 | Mandai et al. | 29/843 |
| 5,147,084 | 9/1992 | Behun et al. | 228/56.3 |
| 5,251,806 | 10/1993 | Agarwala et al. | 228/180.22 |
| 5,261,593 | 11/1993 | Casson et al. | 228/180.22 |
| 5,271,548 | 12/1993 | Maiwald | 228/175 |
| 5,323,947 | 6/1994 | Juskey et al. | 228/56.3 |
| 5,400,950 | 3/1995 | Myers et al. | 228/180.22 |
| 5,551,627 | 9/1996 | Leicht et al. | 228/180.22 |
| 5,634,268 | 6/1997 | Dalal et al. | 228/180.22 |
| 5,684,677 | 11/1997 | Uchida et al. | 361/770 |

OTHER PUBLICATIONS

Bruce Chalmers, *Principles of Solidification*, John Wiley and Sons, New York, 1964, pp. 91–101.

"Attachment Of Solder Ball Connect (SBC) Packages To Circuit Cards", by M.D. Ries et al, IBM J. Res. Develop., vol. 37, No. 5, Sep. 1993, pp. 597–608.

"Evaluation of Critical Design Parameters For Surface Mount Leadless Solder Joints Subjected To Thermal Cycling", by Edward Jih et al, AMD–vol. 187, Mechanics & Materials For Electronic Packaging: vol. 2–Thermal & Mechanical Behavior & Modeling, ASME 1994, pp. 213–228.

*Primary Examiner*—Samuel M. Heinrich
*Assistant Examiner*—Jeffrey T. Knapp
*Attorney, Agent, or Firm*—Richard D. Dixon; Roger L. May

[57] ABSTRACT

A method for joining a component to a substrate applies a base solder portion to the substrate and provides a standoff solder portion in the base solder portion. The standoff solder portion has a higher melting temperature than the base solder portion and a height which substantially corresponds to a desired standoff height between the component and the substrate. The component is positioned on the standoff solder portion and the base solder portion is melted under reflow conditions to form a solder joint between the component and the substrate. This joint substantially encapsulates the standoff solder portion, wherein the reflow conditions create a dendritic structure between the base solder portion and the standoff solder portion.

18 Claims, 2 Drawing Sheets

STANDOFF CONTROLLED INTERCONNECTION

TECHNICAL FIELD

This invention relates to a standoff controlled interconnection for use in a soldering process.

BACKGROUND ART

Electronic components and chips are commonly surface mounted to substrates, such as printed circuit boards, through the use of a solder interconnect or joint. In today's vehicles, this electronic packaging is commonly found in the powertrain, chassis control, and entertainment electronic modules.

Such electronic components may be of the leaded or no-lead (leadless) variety. Examples of the no-lead variety include the Leadless Chip Resistor (LCR), the Leadless Chip Capacitor (LCC), and the Leadless Ceramic Chip Carrier (LCCC). These leadless components are commonly formed of ceramic, such as $Al_2O_3$, and mounted to a printed circuit board by a solder interconnect. The solder interconnect is generally a solder material formed of 37Pb/63Sn weight percent solder.

In contrast to solder interconnects for leaded components having compliant leads, the mismatch of coefficients of thermal expansion between a leadless component and a printed circuit board is borne by the solder interconnect, resulting in an interconnect having a higher stress/strain range and significant plastic deformation, causing the initiation and propagation of creep/fatigue coupled crack growth. As such, solder interconnects for leadless components in electronic packaging often exhibit low cycle thermal and high cycle vibrational fatigue failure under harsh under-hood environments.

The magnitude of the plastic and creep deformation is directly associated with the standoff (height) of the solder interconnect, i.e. the gap between the component and the circuit board. The larger the standoff, the less deformation that occurs thus leading to longer component and assembly lives.

In the past, glass or other types of balls have been utilized in joints between component and substrate. Such arrangements are disclosed in U.S. Pat. No. 5,147,084 issued to Behun et al. and U.S. Pat. No. 5,093,986 issued to Mandai et al. The former discloses a ball grid array pattern which uses a solder ball as a joint between the substrates in conjunction with solder paste for attaching the solder ball to each substrate, while the latter discloses forming electrodes using metal balls and conductive adhesives between two substrates. However, the processes disclosed do not control the standoff height and improve design life of the joint.

Consequently, a need has developed for a method of joining a component to a substrate which controls the standoff of the solder interconnect between the component and the substrate, which results in electronic packaging having improved reliability, cycle life and strength. These improvements are expected to translate into reduced warranty costs.

BRIEF SUMMARY OF THE INVENTION

It is an object of the present invention to provide a method for joining a component to a substrate which controls the standoff between the substrate and the component.

It is a further object of the present invention to provide a method for joining a component to a substrate having improved reliability and durability.

It is a still further object of the present invention to provide a method for joining a component to a circuit board through the use of reflow soldering which creates a dendritic structure in the solder interconnect.

In carrying out these and other objects, features and advantages, the present invention provides a method for joining a component to a substrate which applies a base solder portion to at least one of the substrate and component and provides a standoff solder portion in the base solder portion. The standoff solder portion has a higher melting temperature than the base solder portion and a height which substantially corresponds to a desired standoff height between the component and the substrate. The component and substrate are positioned relative to each other on the standoff solder portion. The base solder portion is melted under reflow conditions to form a solder joint between the component and the substrate. This joint substantially encapsulates the standoff solder portion, wherein the reflow conditions create a dendritic structure between the base solder portion and the standoff solder portion.

The above objects and other objects, features and advantages of the present invention are readily apparent from the following detailed description of the best modes for carrying out the invention when taken in connection with the accompanying drawings wherein like reference numerals correspond to like components.

BEST MODE FOR CARRYING OUT THE INVENTION

Figure 1:
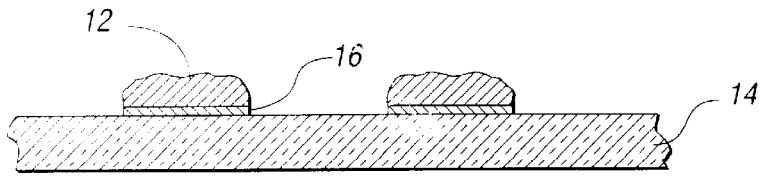
FIG. 1 is a schematic diagram illustrating a deposit of solder paste onto a substrate according to the present invention.

A circuit board assembly at various stages of assembly is illustrated in FIGS. 1–4 and 6. Referring to FIG. 1, a base solder portion, shown as solder paste 12, is stenciled, screen-printed or electro-deposited preferably to printed circuit board (PCB) 14, or its surface 15, by techniques generally known in the art. It is, however, contemplated that the solder paste can be similarly applied to the electronic component (discussed herein), in addition to or in place of substrate 14. Typically, eutectic solder paste 12 has an alloy composition of 63Sn/37Pb weight percent solder and a melting point of 183° C. However, other solder pastes of tin/lead (Sn/Pb) alloy may be used. Another common example is 60Sn/40Pb (the unit for solder alloys discussed herein are in weight percent solder). The amount of solder paste 12 used should correspond to the volume of the desired solder interconnect subtracting the volume of the solder ball or balls 18 contained therein (discussed herein). As shown in FIG. 1 and as is well-known in the art, a bonding pad 16 may also be disposed on surface 15 of PCB 14 for receiving solder paste 12. Bonding pad 16 is commonly formed of a copper material.

Figure 2A:
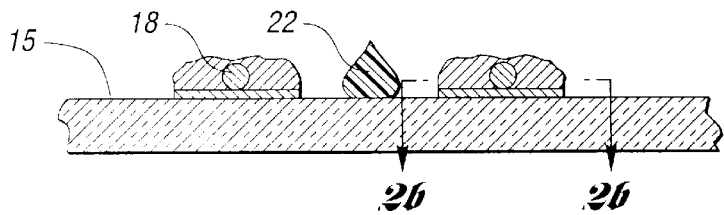
FIG. 2a is a schematic diagram illustrating the application of solder balls to the solder paste, and an epoxy bead, according to the present invention.
Figure 2B:
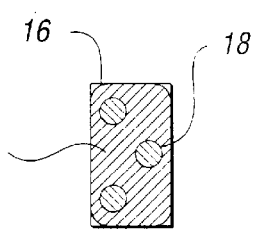
FIG. 2b is a schematic diagram illustrating the top plan view of FIG. 2a according to the present invention.

Referring to FIGS. 2a and 2b, at least one standoff solder portion is held by, or suspended in, solder paste portion 12. The standoff solder portion is typically a solder ball 18 having a substantially spherical shape. As illustrated in FIG. 2a, solder ball 18 may be fully encapsulated in solder paste 12 upon deposit. Note that the invention contemplates that one or more solder balls 18 may be used in conjunction with each solder paste portion 12. Of course, solder ball 18 may be placed into, or premixed with, solder paste 12 before dispensing onto bonding pad 16. The size or diameter of solder ball 18 generally corresponds to the desired standoff 20 (or height) between the component and PCB 14. Solder ball 18 may be any high-Pb composition having a melting point higher than solder paste 12. However, the most common and preferable compositions for solder ball 18 are 95Pb/5Sn weight percent solder, 90Pb/10Sn weight percent solder, or 88Pb/10Sn/2Ag weight percent solder, each having a melting point of approximately 300° C. It is contemplated that solder paste 12 and solder ball 18 may be of the non-lead alloy variety and wherein solder paste 12 has a melting point of at least 50° C. lower than solder ball 18.

In order to achieve a design life of 1000 cycles (1 hour lab thermal cycling between −55° C. and 125° C.), it has been demonstrated for the case of a typical 2512 LCR that standoff 20 should be at least 0.01 in. (0.254 millimeters) to keep the total shear strain range smaller than 0.2%. The solder conditions for the 2512 LCR were as follows: solder paste 12 was 63Sn/37Pb; solder ball 18 was 95Pb/5Sn.

Further referring to FIG. 2a, in one embodiment according to the present invention, an epoxy portion, such as a silica-filled epoxy bead 22, is also applied to PCB 14 for added component retention. Epoxy bead 22 is shown isolated from base solder portion 12 and solder ball 18. Epoxy bead 22 further ensures the low stress/strain state resulting from increasing the standoff height. As shown in FIG. 2a, a small epoxy bead 22 is applied to surface 15 of PCB 14 near the center of the component 24. Epoxy bead 22 bonds the component and the PCB together in the middle portion after reflow, and provides an additional constraint between component 24 and PCB 14 to avoid any unwanted deformation due to the increase of standoff 20. This further ensures the reliability of the solder interconnection. Note that, like solder paste 12, epoxy bead 22 may similarly be applied to the component surface 25, in addition to or instead of substrate 14, discussed herein.

Figure 3:
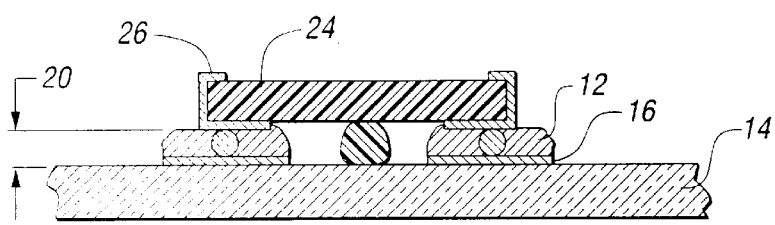
FIG. 3 is a schematic diagram illustrating the mating of a leadless component to the substrate according to the present invention.

With reference to FIG. 3, a component 24 is placed on top of the solder ball 18. Of course, component 24 is positioned so that it has tangential contact with solder ball 18 generally opposite from where solder ball 18 contacts the PCB, so that the desired standoff 20 substantially corresponding to solder ball 18 diameter is achieved. Traditionally, these leadless components commonly formed of ceramic, such as $Al_2O_3$, and mounted to a printed circuit board by a solder interconnect. Each component may also include nickel-coated terminations 26 by which component 24 is supported by the solder interconnect. Examples of the no-lead component variety include the Leadless Chip Resistor (LCR), the Leadless Chip Capacitor (LCC), and the Leadless Ceramic Chip Carrier (LCCC).

The mismatch of coefficients of thermal expansions (CTE) that exists between the (generally ceramic) leadless component and a printed circuit board is borne by the solder interconnect, resulting in a solder joint having a higher stress/strain range and significant plastic deformation, causing the initiation and propagation of creep/fatigue coupled crack growth. The magnitude of the plastic deformation is directly associated with the standoff (height) of the solder interconnect. The larger the standoff, the less plastic deformation that occurs thus leading to a longer component/interconnection durability and cycles life. Thus, controlling standoff 20 according to the present invention results in improved reliability and durability of the solder interconnection between substrate 14 and component 24.

Figure 4:
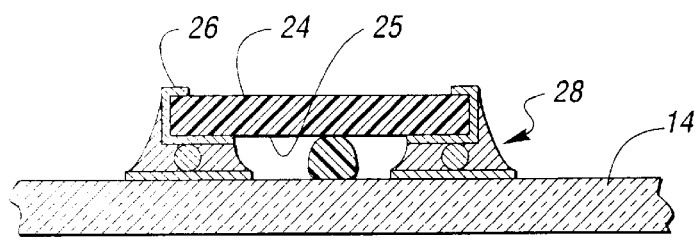
FIG. 4 is a schematic diagram illustrating the results of reflow soldering of the leadless component according to the present invention.

Finally, referring to FIG. 4, a reflow of the solder paste 12 occurs wherein solder paste 12 is melted by heating at or above its melting temperature, wetting bonding pad 16, component terminations 26 of component 24, and solder ball 18, and thereby forming interconnect 28. The reflow conditions are possible by various techniques known in the art. Of course, the temperature used to perform reflow should melt the solder paste 12 having a low melting point, but should not be high enough to melt solder ball 18 (again having a higher melting temperature than solder paste 12). The reflow temperature for solder paste 12 alloy having 63Sn/37Pb and a solder ball of an alloy of 95Pb/5Sn preferably occurs between 220° C. and 230° C. Solder ball 18 should substantially maintain its shape and size in order to achieve the desired predetermined standoff 20 between component 24 and PCB 14.

As shown more fully in FIG. 4, upon melting solder paste 12 during the desired reflow conditions, the resulting solder interconnect 28 encapsulates solder ball 18. Interconnect 28 is allowed to solidify thereby forming a bond between component 24 and PCB 14 resulting in a standoff 20 generally controlled by the diameter of the solder ball 18.

Figure 5:
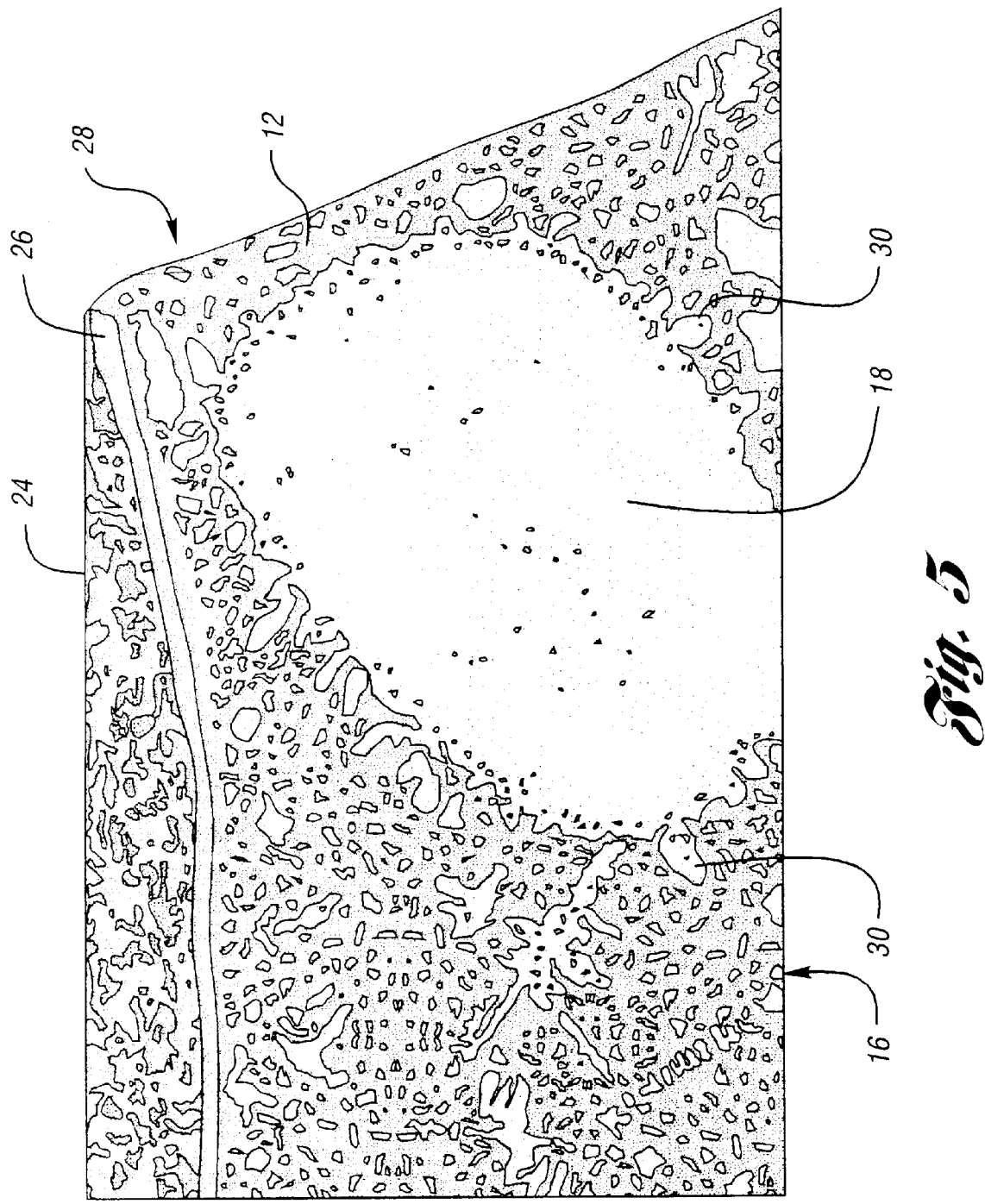
FIG. 5 is a schematic diagram illustrating dendrite formation as a result of reflow soldering according to the present invention.

Testing has shown that, during the reflow melting and solidification steps described above, Pb-rich dendrites 30 are formed along the periphery of the encapsulated solder ball 18 occurring as a result of interdiffusion between the lead (Pb) and tin (Sn) between solder paste 12 and solder ball 18. Typical dendrite formation is illustrated in FIG. 5 (magnified ×250). Dendrites occur when the surface of solder ball 18 softens and diffuses into the low melt solder paste 12. As a result, the surface of solder ball 18, initially smooth, will be rendered otherwise. Such metallurgical dendrites 30 provide an additional bond between solder ball 18 and solder paste 12 matrix that improves the reliability of solder interconnect 28.

Referring again to FIG. 5, Pb-rich dendrites 30 have been shown to form along 95Pb/5Sn weight percent solder balls 18, resulting from faster cooling at the solid/liquid (or paste 12/ball 18) interface during the solidification of solder interconnect 28. The presence of dendrite 30 formation may be easily detected by one of ordinary skill in the art through the use of scanning electron microscopy of interconnect 28. Generally, dendrite 30 formation is a function of cooling temperature: the faster interconnect 28 is cooled the fewer dendrites 30 form.

During cooling and solidification, the temperature of the molten solder paste 12 is lower than that of solder ball 18, due to the release of the latent heat of fusion which is transferred to solder ball 18. Any protrusion on the non-smooth solder ball 18 surface will have a slightly lower temperature than the solder ball 18 because of the temperature gradient. Since the solidification rate is dependent upon temperature, more dendrites 30 will grow from the small surface protrusions at a slower rate.

The resulting dendritic structure produces stronger bonding between the low melting temperature solder paste 12 and the higher melting temperature solder ball 18 (the terms low melting and high melting being used in a relative sense). Without wishing to be bound to any particular theory, it is believed that the dendritic structures created increase the strength of the solder joint as well as serve to arrest the propagation of cracks, etc.

Of course, the diameter of solder ball 18 may be of any diameter sufficient to achieve the desired cycle life and design parameters. Solder ball 18 should generally have a diameter in the range from 0.005 to 0.020 inches (0.127 to 0.5 mm). It is contemplated that the standoff solder portions may have a variety of shapes applicable to this application, in addition to the spherical shape, and whereby the height of the standoff portion would correspond to the diameter of solder ball 18. Moreover, while the height or diameter of solder ball 18 should generally correspond to the desired standoff 20 (or height) between the component and PCB 14, those skilled in the art may seek to compensate for the very slight changes in height subsequent reflow due to dendrite formation. By the term "substantially corresponding" in this respect is preferably meant a height which is greater than 80% of the height predicted from the solder ball diameter, and more preferably greater than 90% of this value.

Figure 6:
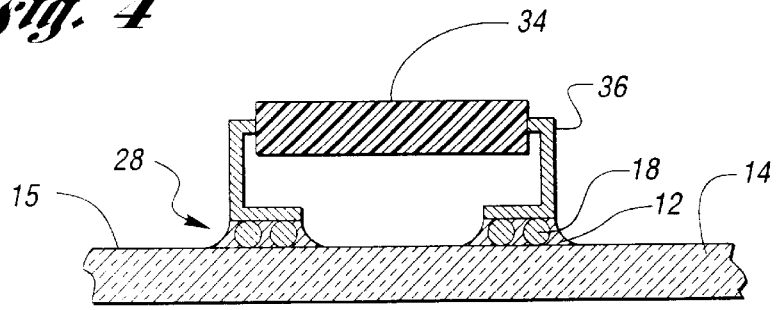
FIG. 6 is a schematic diagram illustrating the results of reflow soldering on a leaded component according to the present invention.

As illustrated in FIG. 6, it is also contemplated that leaded components 34, such as ceramic and plastic quad flat packs, diodes and transistors may also be surface mounted to a PCB in a manner according to the present invention. While the CTE mismatch concerns are not as great as with the mating of leadless components to their substrates, the teachings herein will similarly apply. Leaded components 34 have leads 36 which are commonly in the form of gull-wing, J-shaped (shown in FIG. 6), or butt-shaped with one end of the lead molded into the component and the other end mounted on the PCB 14 or substrate with a solder interconnect 28 as described above.

It is understood, of course, that while the forms of the invention herein shown and described include the best mode contemplated for carrying out the present invention, they are not intended to illustrate all possible forms thereof. It will also be understood that the words used are descriptive rather than limiting, and that various changes may be made without departing from the spirit or scope of the invention as claimed below.

What is claimed is:

1. A reflow method for interconnecting an electronic component to a substrate, comprising:
    applying a base solder portion to a surface of at least one of the electronic component and the substrate;
    providing a standoff solder portion in the base solder portion, the standoff solder portion having a higher melting temperature than the base solder portion and having a height substantially corresponding to a desired standoff height between the substrate and the electronic component;
    positioning the electronic component and the substrate relative to each other to engage the solder standoff portion; and
    reflow melting the base solder portion to form a solder joint between the electronic component and the substrate which encapsulates the solder ball.

2. The method of claim 1 wherein the solder ball is selected from a group consisting of a 88Pb/10Sn/2Ag weight percent solder ball, a 90Pb/10Sn weight percent solder ball, or a 95Pb/5Sn weight percent solder ball.

3. The method claim 1 wherein the base solder portion comprises 37Pb/63Sn weight percent solder.

4. The method of claim 1 further comprising providing an epoxy bead between the electronic component and the substrate and which is isolated from the base and standoff solder portions for providing further retention.

5. The method of claim 1 further comprising providing a bonding pad disposed on the surface of the at least one of the electronic component and substrate for receiving the base solder portion.

6. A method for joining a component to a substrate, comprising:
    applying a base solder portion to at least one of the substrate and the component;
    providing at least one standoff solder portion in the base solder portion for providing a desired solder height, the standoff solder portion having a higher melting temperature than the base solder portion and a height substantially corresponding to a desired standoff height between the component and the substrate;
    mating at least one of the substrate and the component with the standoff solder portion; and
    melting the base solder portion under reflow conditions to form a solder joint between the component and the substrate which encapsulates the standoff solder portion.

7. The method claim 6 wherein the base solder portion comprises 37Pb/63Sn weight percent solder.

8. The method of claim 6 wherein the standoff solder portion has a spherical shape and the height of the standoff solder portion generally corresponds to the diameter of the spherical shape.

9. The method of claim 6 wherein the standoff solder portion is selected from a group consisting of a 88Pb/10Sn/2Ag weight percent solder ball, a 90Pb/10Sn weight percent solder ball, or a 95Pb/5Sn weight percent solder ball.

10. The method of claim 6 further comprising placing an epoxy bead to the at least one of the component and substrate which is isolatedly positioned away from the base and standoff solder portions, for providing further retention between the component and the substrate.

11. The method of claim 6 further comprising providing a bonding pad disposed on the at least one of the component and substrate for receiving the base solder portion.

12. An interconnection method for a circuit board assembly, comprising:
    depositing a pair of solder paste portions to a surface of a substrate;
    providing a solder ball in each of the pair of solder paste portions, the solder ball having a higher melting temperature than the solder paste portions;
    positioning a component having a pair of mounting surfaces, each mounting surface to mate with a corresponding solder ball so that the diameter of the solder ball substantially corresponds to a desired standoff height between the substrate and the component; and
    melting the base solder portion under reflow conditions to form a solder joint between the component and the substrate which encapsulates the solder ball, wherein the reflow conditions create a dendritic structure between the solder paste and the solder ball.

13. The method of claim 12 wherein the component is selected from a group consisting of a Leadless Chip Resistor (LCR), a Leadless Chip Capacitor (LCC), and a Leadless Ceramic Chip Carrier (LCCC).

14. The method of claim 12 wherein the substrate is a printed circuit board.

15. The method of claim 12 wherein the solder ball is selected from a group consisting of a 88Pb/10Sn/2Ag weight percent solder ball, a 90Pb/10Sn weight percent solder ball, or a 95Pb/5Sn weight percent solder.

16. The method of claim 12 wherein the solder paste comprises 37Pb/63Sn weight percent solder.

17. The method of claim 12 further comprising providing an epoxy bead engaging the component and the substrate and which is isolated from the solder paste portions and solder ball, for providing further retention between the component and the substrate.

18. The method of claim 12 further comprising providing at least one bonding pad disposed on the surface of the substrate for receiving the solder paste portions.

* * * * *